(12) United States Patent
Liu

(10) Patent No.: US 9,508,745 B1
(45) Date of Patent: Nov. 29, 2016

(54) ARRAY SUBSTRATE AND METHOD OF FABRICATING THE SAME

(71) Applicant: WUHAN CHINA STAR OPTOELECTRONICS TECHNOLOGY CO., LTD., Wuhan (CN)

(72) Inventor: Yuanfu Liu, Wuhan (CN)

(73) Assignee: WUHAN CHINA STAR OPTOELECTRONICS TECHNOLOGY CO. LTD., Wuhan (CN)

(*) Notice: Subject to any disclaimer, the term of this patent is extended or adjusted under 35 U.S.C. 154(b) by 0 days.

(21) Appl. No.: 14/994,633

(22) Filed: Jan. 13, 2016

(30) Foreign Application Priority Data

Oct. 12, 2015 (CN) .......................... 2015 1 0658689

(51) Int. Cl.
| | | |
|---|---|---|
| H01L 21/00 | (2006.01) | |
| H01L 27/01 | (2006.01) | |
| H01L 51/10 | (2006.01) | |
| H01L 51/40 | (2006.01) | |
| H01L 27/12 | (2006.01) | |
| H01L 29/786 | (2006.01) | |
| H01L 51/00 | (2006.01) | |
| H01L 27/32 | (2006.01) | |

(52) U.S. Cl.
CPC ......... *H01L 27/1222* (2013.01); *H01L 27/127* (2013.01); *H01L 27/323* (2013.01); *H01L 27/3272* (2013.01); *H01L 29/78621* (2013.01); *H01L 29/78633* (2013.01); *H01L 29/78678* (2013.01); *H01L 29/78696* (2013.01); *H01L 51/0023* (2013.01); *H01L 51/102* (2013.01)

(58) Field of Classification Search
CPC ............. H01L 27/1222; H01L 27/127; H01L 27/323; H01L 27/3272; H01L 29/78621; H01L 29/78633; H01L 29/78678; H01L 29/78696; H01L 51/0023; H01L 51/102

USPC ........ 438/34, 99, 149, 151, 159; 257/40, 43, 257/59, 72, 350, E21.027, E21.412, 257/E21.414, E27.111, E27.113, E29.273, 257/E29.277, E29.278, E29.292, E33.062, 257/E33.001, E51.006, E51.025

See application file for complete search history.

(56) References Cited

U.S. PATENT DOCUMENTS

| | | | | |
|---|---|---|---|---|
| 5,953,595 | A * | 9/1999 | Gosain ...................... | G03F 7/42 257/E21.025 |
| 6,828,582 | B1 * | 12/2004 | Ando ...................... | B82Y 10/00 257/350 |
| 2002/0149057 | A1 * | 10/2002 | Kawasaki ......... | G02F 1/133345 257/350 |
| 2008/0142804 | A1 * | 6/2008 | Oh ...................... | G02F 1/13454 257/59 |
| 2010/0176379 | A1 * | 7/2010 | Kim ...................... | H01L 51/0021 257/40 |
| 2010/0264410 | A1 * | 10/2010 | Nomoto .............. | H01L 51/0023 257/40 |

* cited by examiner

*Primary Examiner* — Dao H Nguyen
(74) *Attorney, Agent, or Firm* — Osha Liang LLP

(57) ABSTRACT

An array substrate and a fabricating method thereof are disclosed. The array substrate has a transparent substrate, a buffer layer, a first/second gate pattern, a transparent insulating layer and a first/second polysilicon pattern. The buffer layer is located on first/second portions of the transparent substrate. The first/second gate patterns are formed on the buffer layer and located respectively on the first/second portions. The transparent insulating layer covers the first/second gate patterns and the buffer layer. The first/second polysilicon patterns are formed on the transparent insulating layer, and have neighboring first/second regions and neighboring third/fourth regions; the second/fourth regions are first/second lightly doped polysilicon regions respectively; the first region and the first gate pattern have an identical first patterning shape; and the third region and the second gate pattern have an identical second patterning shape. The array substrate has a simple process, low producing cost, and high product yield.

9 Claims, 7 Drawing Sheets

US 9,508,745 B1

ARRAY SUBSTRATE AND METHOD OF FABRICATING THE SAME

RELATED APPLICATIONS

This application claims priority to China Application Serial Number 201510658689.1, filed Oct. 12, 2015, which is herein incorporated by reference.

FIELD OF THE INVENTION

The present invention relates to a substrate and a method of fabricating the same, and more particularly to an array substrate and a method of fabricating the same.

BACKGROUND OF THE INVENTION

Because low temperature poly-silicon (LIPS) has a high electron mobility, the area of devices of a thin film transistor (TFT) can be reduced effectively, thereby improving an opening rate of a pixel. Not only can the brightness of a display panel be raised, but also the entire energy consumption is reduced at the same time, so as to decrease the fabricating cost of the display panel significantly.

Please refer to FIG. 1, which is a cross-sectional schematic diagram of a conventional array substrate 10. The array substrate 10 comprises a substrate 101, a buffer layer 102, a light shielding layer 103, a polysilicon layer 104, an insulating layer 105, a gate 106, two interlayer connecting layers 107A and 108B, a source 108A, a drain 108B, an insulating layer 109, a conductive layer 110, an insulating layer 111, and a conductive layer 112. Top gate structures are all used in the conventional array substrate. The purpose of fabricating a self-aligned light doped drain (LDD) is achieved by the top gate shielding a channel, for reducing the overlapping of the drain and the LDD. However, the conventional method of fabricating a complementary metal oxide semiconductor (CMOS) needs 11 masks, therefore the process is complex, the fabricating cost is relatively high, and the product yield is difficult to improve.

As a result, it is necessary to provide an array substrate and a method of fabricating the same to solve the problems existing in the conventional technologies.

SUMMARY OF THE INVENTION

In view of this, the present invention provides an array substrate and a method of fabricating the same to solve the problems existing in the conventional technologies, in which the process is complex, the fabricating cost is relatively high, and the product yield is difficult to improve.

A primary object of the present invention is to provide a method of fabricating an array substrate, which can use a fewer number of masks to fabricate an array substrate using LTPS.

To achieve the above object of the present invention, an embodiment of the present invention provides a method of fabricating an array substrate, which comprises the steps of: providing a transparent substrate having a first portion and a second portion neighboring each other, and a first surface and a second surface facing each other; forming a buffer layer on the first surface of the transparent substrate, wherein the buffer layer is located on the first portion and the second portion; forming a first gate pattern and a second gate pattern on the buffer layer, wherein the first gate pattern and the second gate pattern are formed respectively on the first portion and the second portion; providing a transparent insulating layer covering the first gate pattern, the second gate pattern and the buffer layer; forming a first polysilicon pattern and a second polysilicon pattern on the transparent insulating layer, wherein the first polysilicon pattern has a first region and a second region adjacent to the first region, and the second polysilicon pattern has a third region and a fourth region adjacent to the third region; providing a photoresist layer covering the first polysilicon pattern, the second polysilicon pattern and the transparent insulating layer; providing an exposure light source in a direction from the second surface toward the first surface of the transparent substrate by using the first gate pattern and the second gate pattern as a light shielding layer, such that the photoresist layer forms a first photoresist pattern on the first region of the first polysilicon pattern and a second photoresist pattern on the third region of the second polysilicon pattern; and performing a first doping step to the first polysilicon pattern and the second polysilicon pattern in a direction from the first surface toward the second surface of the transparent substrate, such that the second region forms a first lightly doped polysilicon region and the fourth region forms a second lightly doped polysilicon region.

In one embodiment of the present invention, the first doping step is to dope a plurality of n-type dopants into the second region and the fourth region by using an ion implanting process.

In one embodiment of the present invention, after performing the first doping step, the method further comprises: performing a second doping step so as to form an n-type heavily doped polysilicon region in a peripheral portion of the first lightly doped polysilicon region, wherein the first lightly doped polysilicon region is located between the n-type heavily doped polysilicon region and the first region.

In one embodiment of the present invention, after performing the second doping step, the method further comprises: performing a third doping step to form a p-type heavily doped polysilicon region in the fourth region by implanting a plurality of p-type dopants in an ion implanting process.

In one embodiment of the present invention, after performing the third doping step, the method further comprises: forming a first source and a first drain on the n-type heavily doped polysilicon region; and forming a second source and a second drain on the p-type heavily doped polysilicon region.

In one embodiment of the present invention, after performing the step of forming the first source/drain and the second source/drain respectively on the n-type heavily doped polysilicon region and the p-type heavily doped polysilicon region, the method further comprises: providing a first insulating layer covering the first source, the first lightly doped polysilicon region, the first region, the transparent insulating layer, the second source, the third region and the second drain, so as to expose the first drain.

In one embodiment of the present invention, the method further comprises: forming a first transparent conductive layer on the first insulating layer.

In one embodiment of the present invention, the method further comprises: providing a second insulating layer covering the first transparent conductive layer and the first insulating layer, so as to expose the first drain.

In one embodiment of the present invention, the method further comprises: providing a second transparent conductive layer patterned and formed on the first drain and the second insulating layer.

To achieve the above object of the present invention, an embodiment of the present invention provides an array substrate, which comprises a transparent substrate, a buffer layer, a first gate pattern, a second gate pattern, a transparent insulating layer, a first polysilicon pattern, and a second polysilicon pattern. The transparent substrate has a first portion and a second portion neighboring each other, and a first surface and a second surface facing each other. The buffer layer is formed on the first surface of the transparent substrate, wherein the buffer layer is located on the first portion and the second portion. The first gate pattern and the second gate pattern are formed on the buffer layer, wherein the first gate pattern and the second gate pattern are formed respectively on the first portion and the second portion. The transparent insulating layer covers the first gate pattern, the second gate pattern and the buffer layer. The first polysilicon pattern and the second polysilicon pattern are formed on the transparent insulating layer, wherein the first polysilicon pattern has a first region and a second region adjacent to the first region, and the second polysilicon pattern has a third region and a fourth region adjacent to the third region; wherein the second region is a first lightly doped polysilicon region and the fourth region is a second lightly doped polysilicon region; the first region and the first gate pattern have an identical first patterning shape; and the third region and the second gate pattern have an identical second patterning shape.

DETAILED DESCRIPTION OF THE PREFERRED EMBODIMENTS

The following description of the embodiments with reference to the appended drawings is used for illustrating specific embodiments, which may be used for carrying out the present invention. Furthermore, the directional terms described by the present invention, such as upper, lower, top, bottom, front, back, left, right, inner, outer, side, around, center, horizontal, lateral, vertical, longitudinal, axial, radial, uppermost or lowermost, etc., are only directions by referring to the accompanying drawings. Thus, the used directional terms are used to describe and understand the present invention, but the present invention is not limited thereto.

Please refer to FIG. 2A to FIG. 2J, which are cross-sectional schematic diagrams of an array substrate 20 in each of the processes according to one embodiment of the present invention. Please refer to FIG. 2A first, a transparent substrate 21 is provided, which has a first portion 21A and a second portion 21B neighboring each other, and a first surface 21C and a second surface 21D facing each other. The transparent substrate 21 may be a glass substrate. Then, a buffer layer 22 is formed on the first surface 21C of the transparent substrate 21, wherein the buffer layer 22 is located on the first portion 21A and the second portion 21B. For example, the buffer layer 22 is deposited on the first surface 21C of the transparent substrate 21. The buffer layer 22 is mainly used to prevent ions in the transparent substrate 21 from diffusing into a first polysilicon pattern and a second polysilicon pattern formed later (shown in FIG. 2C).

Figure 1:
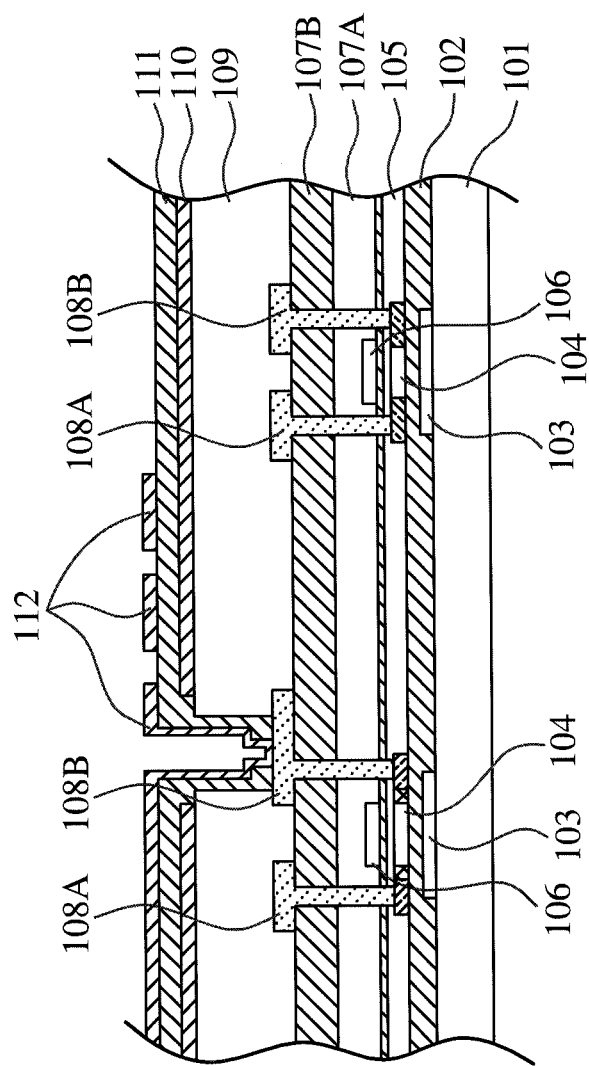
FIG. 1 is a cross-sectional schematic diagram of a conventional array substrate.
Figure 2A:
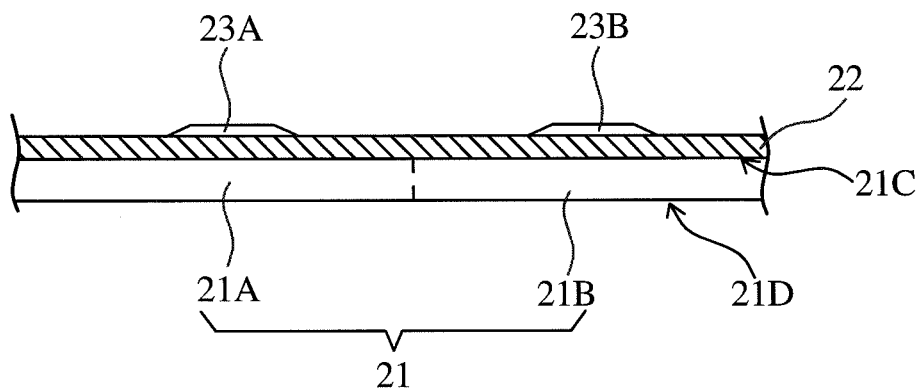
FIG. 2A to 2J are cross-sectional schematic diagrams of an array substrate in each of the processes according to one embodiment of the present invention.

Please further refer to FIG. 2A, a first gate pattern 23A and a second gate pattern 23B are then formed on the buffer layer 22, wherein the first gate pattern 23A and the second gate pattern 23B are formed respectively on the first portion 21A and the second portion 21B. In one embodiment, a conductive layer (not shown), formed from the materials such as molybdenum, aluminum, copper, tungsten, titanium, or alloys thereof, may be deposited on the buffer layer 22, and then, the conductive layer transforms into the first gate pattern 23A and the second gate pattern 23B by a lithography etching technology. In other words, here it needs to use a first mask process to form the first gate pattern 23A and the second gate pattern 23B.

Figure 2B:
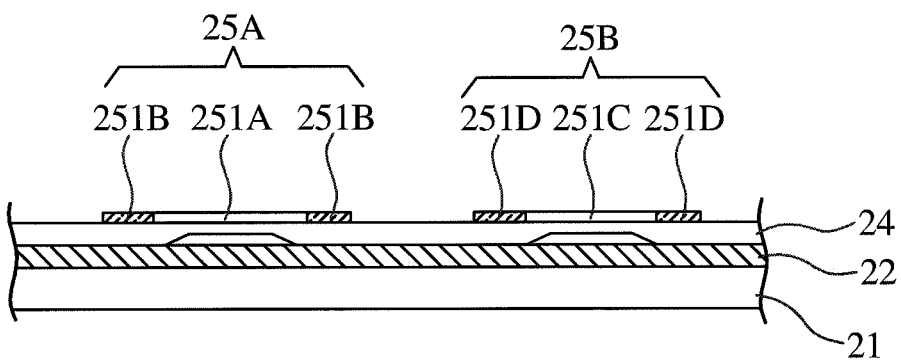

Please refer to FIG. 2B, a transparent insulating layer 24 is provided to cover the first gate pattern 23A, the second gate pattern 23B and the buffer layer 22, such that the first gate pattern 23A and the second gate pattern 23B are electrically isolated from other devices. In one embodiment, the transparent insulating layer 24 is formed by using a depositing method for covering the first gate pattern 23A, the second gate pattern 23B and the buffer layer 22.

Then, a first polysilicon pattern 25A and a second polysilicon pattern 25B are formed on the transparent insulating layer 24, wherein the first polysilicon pattern 25A has a first region 251A and a second region 251B adjacent to (surrounding) the first region 251A, and the second polysilicon pattern 25B has a third region 251C and a fourth region 251D adjacent to (surrounding) the third region 251C. In one embodiment, an amorphous silicon layer (not shown) can be deposited on the transparent insulating layer 24 first, and the amorphous silicon layer is warmed and transforms into a polysilicon layer by using a low temperature laser crystallization method, and then the polysilicon layer transforms into the first polysilicon pattern 25A and the second polysilicon pattern 25B are formed by using a lithography etching technology. In other words, here a second mask process needs to be used to form the first polysilicon pattern 25A and the second polysilicon pattern 25B.

Figure 2C:
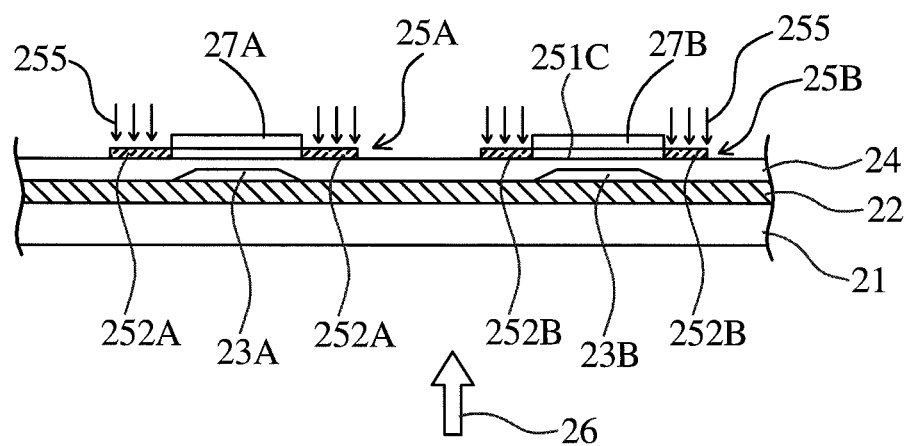

Please further refer to FIG. 2C, a photoresist layer is provided to cover the first polysilicon pattern 25A, the second polysilicon pattern 25B and the transparent insulating layer 24. Then, an exposure light source 26 is provided in a direction from the second surface 21D toward the first surface 21C of the transparent substrate 21 by using the first gate pattern 23A and the second gate pattern 23B as a light shielding layer, such that the photoresist layer forms a first photoresist pattern 27A on the first region 251A of the first polysilicon pattern 25A and a second photoresist pattern 27B on the third region 251C of the second polysilicon pattern 25B. In other words, the array substrate 20 of the embodiment of the present invention uses the first gate pattern 23A and the second gate pattern 23B, which are located below, as a light shielding layer, such that the first photoresist pattern 27A and the second photoresist pattern 27B can be formed without the need of a mask process. In one embodiment, in a direction of top-view or bottom view of the transparent substrate 21, the first region 251A and the first gate pattern 23A therefore have an identical first patterned shape; and the third region 251C and the second gate pattern 23B also have an identical second patterned shape.

Please further refer to FIG. 2C, a first doping step 255 is performed to the first polysilicon pattern 25A and the second polysilicon pattern 25B in a direction from the first surface 21C toward the second surface 21D of the transparent substrate 21, such that the second region 251B forms a first lightly doped polysilicon region 252A and the fourth region 251D forms a second lightly doped polysilicon region 252B, so as to fabricate the array substrate of embodiments of the present invention, wherein the first lightly doped polysilicon region 252A and the second lightly doped polysilicon region 252B are mainly used as an area of a lightly doped drain for reducing a hot electron effect. In one embodiment, the first doping step uses an ion implanting method to implant a plurality of n-type dopants into the second region 251B and the fourth region 251D.

Figure 2D:
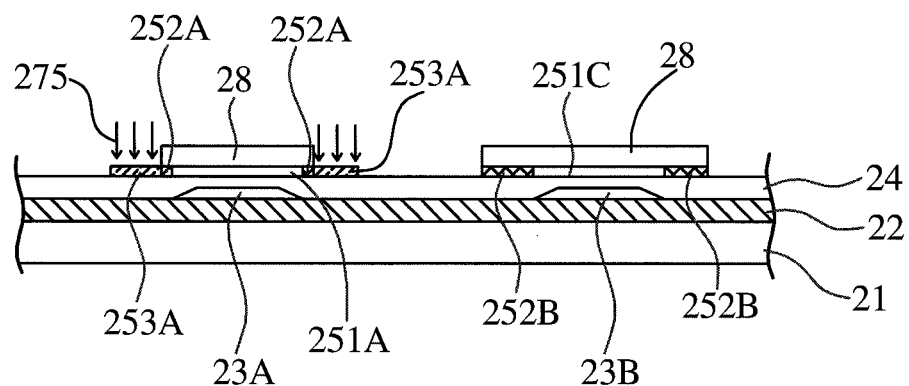

In another embodiment, please refer to FIG. 2D, the first photoresist pattern 27A and the second photoresist pattern 27B are first removed, and then a second doping step is performed so as to form a n-type heavily doped polysilicon region 253A in a peripheral portion of the first lightly doped polysilicon region 252A, wherein the first lightly doped polysilicon region 252A is located between the n-type heavily doped polysilicon region 253A and the first region 251A. In one embodiment, the regions without having to accept doping may be shielded by the patterned photoresist layer 28 through a lithography etching technology. After the second doping step is performed, the photoresist layer 28 is then removed. The n-type heavily doped polysilicon region 253A is mainly used to produce an ohmic contact effect between a first source/drain formed later (shown in FIG. 2F) and the first region 251A of the first polysilicon pattern 25A. In other words, a third mask process needs to be used to form the n-type heavily doped polysilicon region 253A.

Figure 2E:
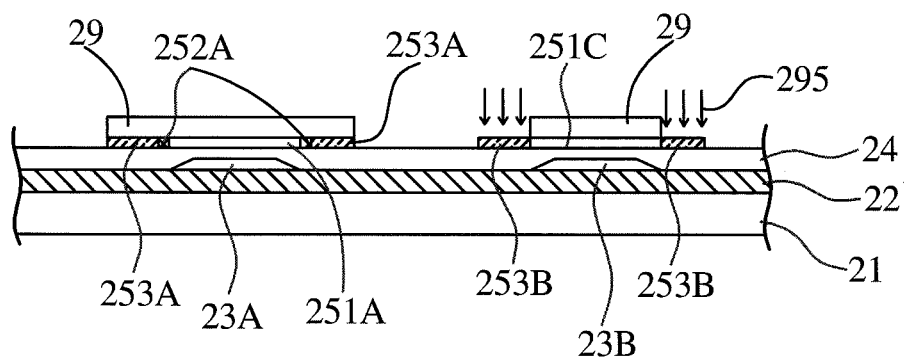

In a further embodiment, please refer to FIG. 2E continuingly, the photoresist layer 28 is first removed, and then a third doping step is performed to form a p-type heavily doped polysilicon region 253B in the fourth region 251D by implanting a plurality of p-type dopants into the fourth region 251D using an ion implanting process. In one embodiment, the regions without having to accept doping may be shielded by the patterned photoresist layer 29 through a lithography etching technology. After the third doping step is performed, the photoresist layer 29 is then removed. The p-type heavily doped polysilicon region 253B is mainly used to produce an ohmic contact effect between a second source/drain formed later (shown in FIG. 2F) and the third region 251C of the second polysilicon pattern 25B. In other words, here it needs to use a fourth mask process to form the p-type heavily doped polysilicon region 253B.

Figure 2F:
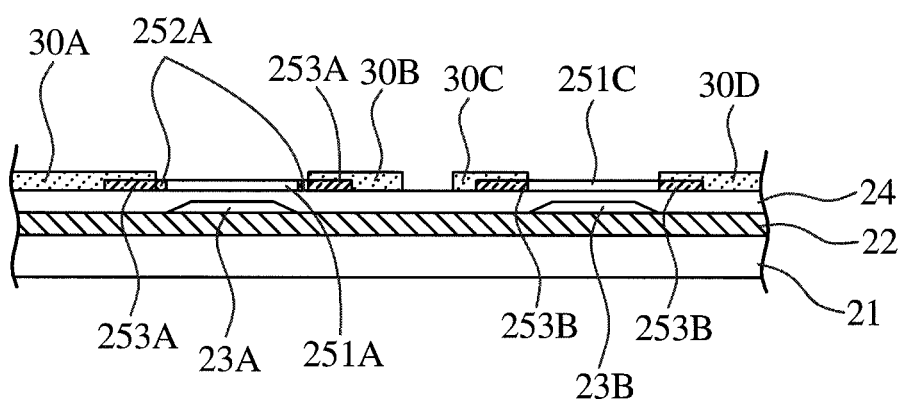

In a further embodiment, please refer to FIG. 2F, the photoresist layer 29 is first removed, and then a first source 30A and a first drain 30B are formed on the n-type heavily doped polysilicon region 253A; and a second source 30C and a second drain 30D are formed on the p-type heavily doped polysilicon region 253B. In one embodiment, a metal layer (not shown) may be deposited first on the transparent conductive layer 24, the n-type heavily doped polysilicon region 253A, the first region 251A, the first lightly doped polysilicon region 252A and the p-type heavily doped polysilicon region 253B, and then the metal layer is patterned to form the first source 30A, the first drain 30B, the second source 30C and the second drain 30D by a lithography etching technology. In other words, a fifth mask process needs to be used to form the first source 30A, the first drain 30B, the second source 30C and the second drain 30D.

Figure 2G:
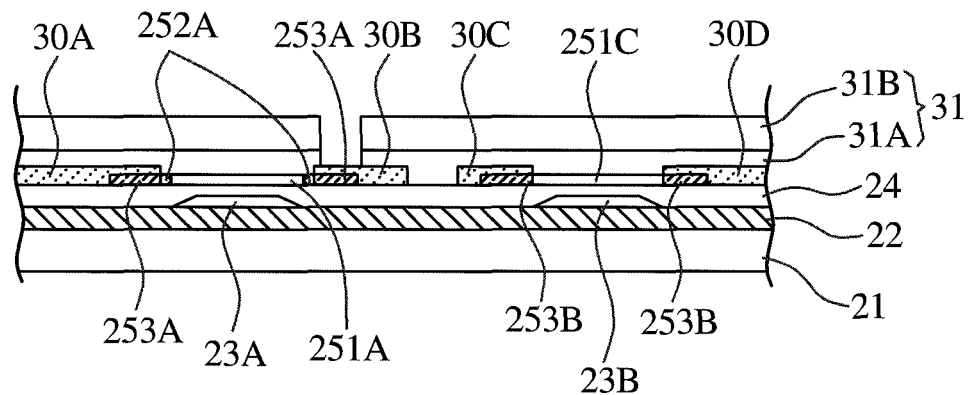

In a further embodiment, please refer to FIG. 2G, a first insulating layer 31 is provided to cover the first source 30A, the first lightly doped polysilicon region 252A, the first region 251A, the transparent insulating layer 24, the second source 30C, the third region 251C and the second drain 30D, so as to expose the first drain 30B. The first insulating layer 31 is mainly used to electrically isolate the first drain 30B from other elements. In one embodiment, the first insulating layer 31 can be a bilayer structure. For example, an inorganic insulating layer 31A formed from SiNx, SiO2 or a combination thereof is first deposited, and then a transparent insulating layer 31B is deposited. Thereafter, the first insulating layer 31 is formed by a lithography etching technology. In other words, a sixth mask process needs to be used to form the first insulating layer 31.

Figure 2H:
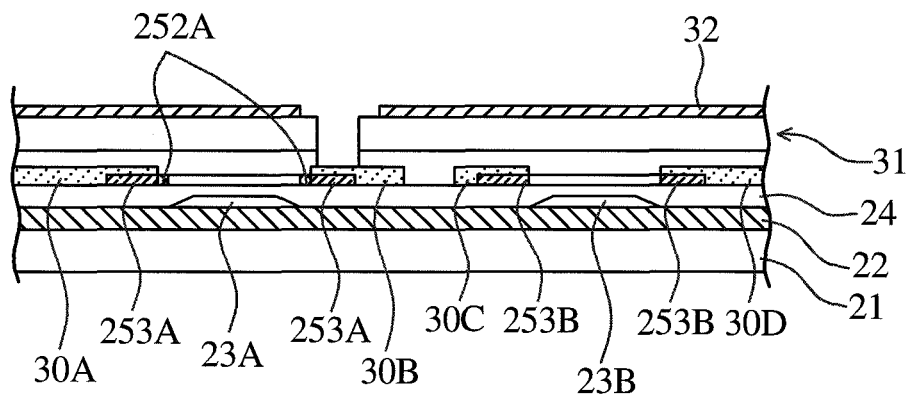

In a further embodiment, please refer to FIG. 2H, a first transparent conductive layer 32 is formed on the first insulating layer 31. In one embodiment, a completing layer of a transparent conductive layer (not shown) is deposited first, and then the first transparent conductive layer 32 with a through hole 32A in a common electrodes shape is formed by using a lithography etching technology. In other words, a seventh mask process needs to be used to form the first transparent conductive layer 32.

Figure 2I:
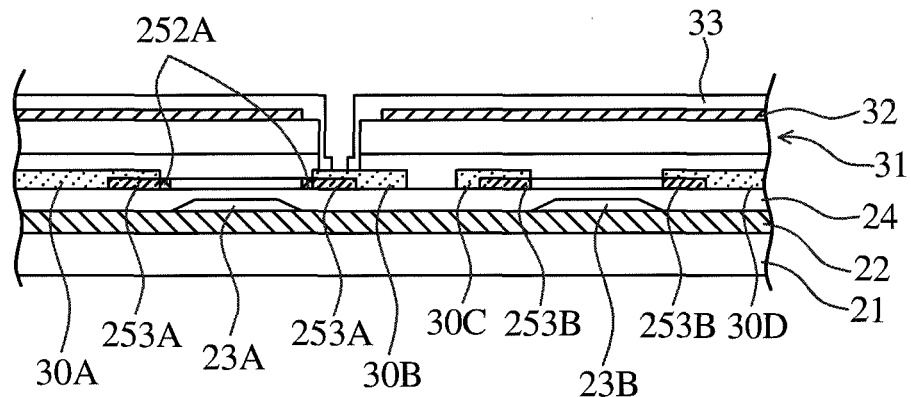

In a further embodiment, please refer to FIG. 2I, a second insulating layer 33 is provided to cover the first transparent conductive layer 32 and the first insulating layer 31, so as to expose the first drain 30B, which can be used in changing line. In one embodiment, a completing layer of an insulating layer (not shown) is deposited first, and then the second insulating layer 33 is formed by using a lithography etching technology, so as to electrically isolate the first transparent conductive layer 32 from other electron elements. In other words, an eighth mask process needs to be used to form the second insulating layer 33.

Figure 2J:
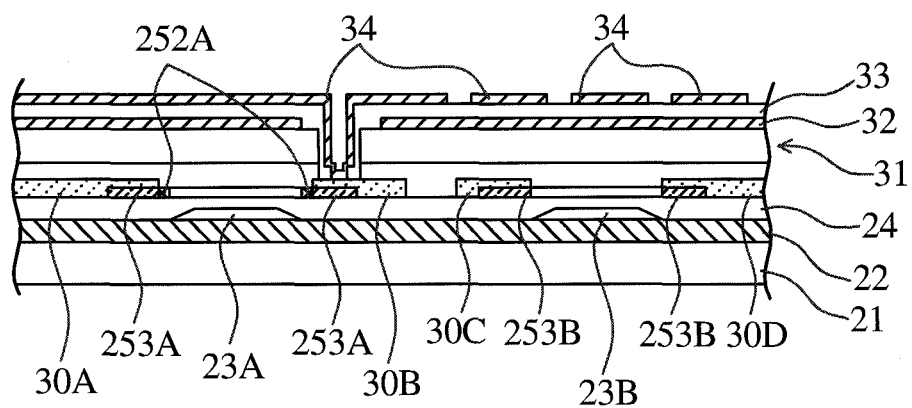

In a further embodiment, please refer to FIG. 2J, a second transparent conductive layer 34 is provided to pattern and form on the first drain 30B and the second insulating layer 33. In one embodiment, a completing layer of a transparent conductive layer (not shown) is deposited first, and then the second transparent conductive layer 34 is formed by using a lithography etching technology, so as to form the second transparent conductive layer 34 with a pattern, which is used as a pixel electrode.

Figure 3:
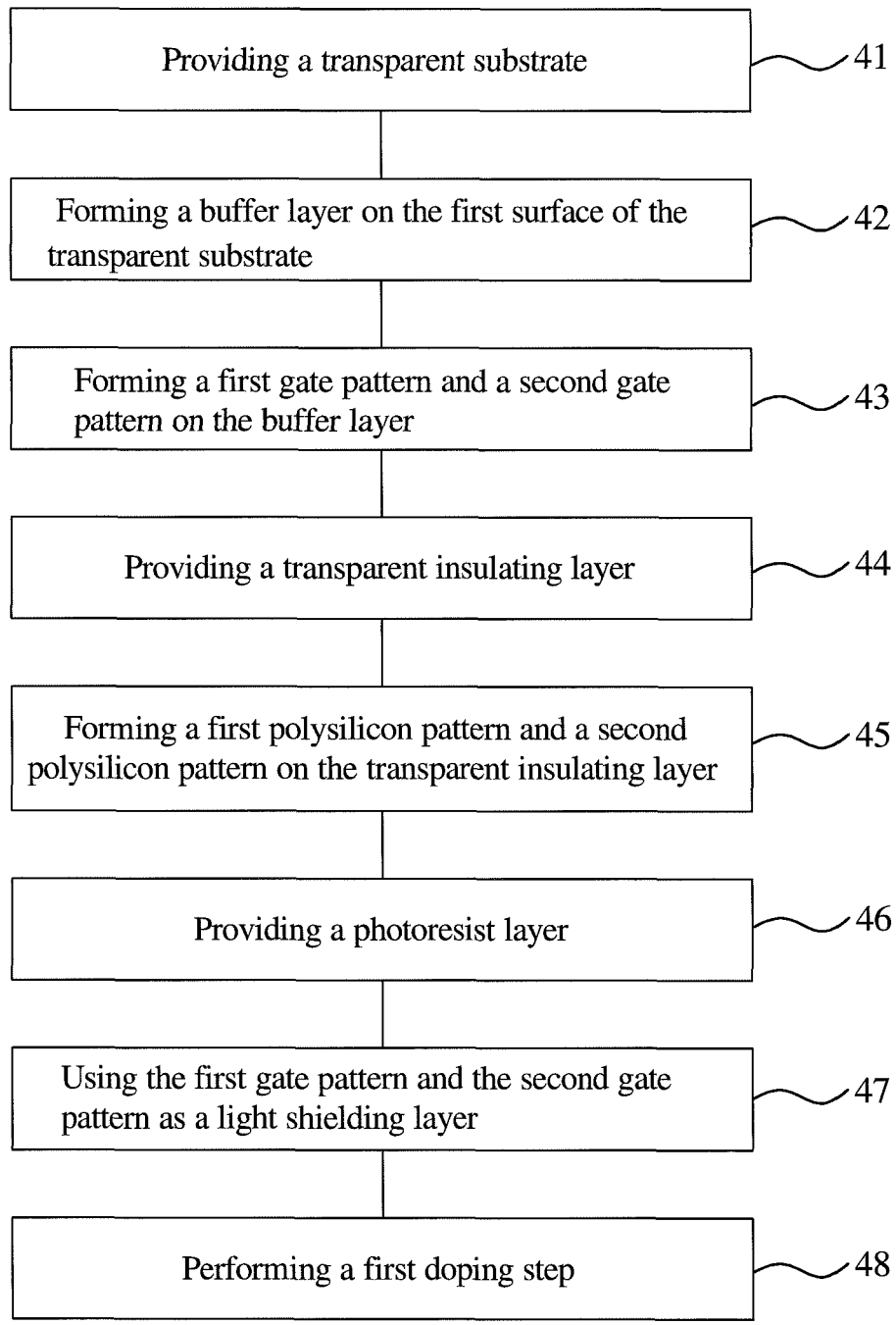
FIG. 3 is a flow chart of a method of fabricating an array substrate according to one embodiment of the present invention.

Please refer to FIG. 3, which is a flow chart of a method of fabricating an array substrate according to one embodiment of the present invention. The present invention provides a method 40 of fabricating an array substrate, comprising the steps of: providing a transparent substrate having a first portion and a second portion neighboring each other, and a first surface and a second surface facing each other (step 41); forming a buffer layer on the first surface of the transparent substrate, wherein the buffer layer is located on the first portion and the second portion (step 42); forming a first gate pattern and a second gate pattern on the buffer layer, wherein the first gate pattern and the second gate pattern are formed respectively on the first portion and the second portion (step 43); providing a transparent insulating layer covering the first gate pattern, the second gate pattern and the buffer layer (step 44); forming a first polysilicon pattern and a second polysilicon pattern on the transparent insulating layer, wherein the first polysilicon pattern has a first region and a second region adjacent to the first region, and the second polysilicon pattern has a third region and a fourth region adjacent to the third region (step 45); providing a photoresist layer covering the first polysilicon pattern, the second polysilicon pattern and the transparent insulating layer (step 46); providing an exposure light source in a direction from the second surface toward the first surface of the transparent substrate by using the first gate pattern and the second gate pattern as a light shielding layer, such that the photoresist layer forms a first photoresist pattern on the first region of the first polysilicon pattern and a second photoresist pattern on the third region of the second polysilicon pattern (step 47); and performing a first doping step to the first polysilicon pattern and the second polysilicon pattern in a direction from the first surface toward the second surface of the transparent substrate, such that the second region forms a first lightly doped polysilicon region and the fourth region forms a second lightly doped polysilicon region (step 48).

It is noted that the array substrate of embodiments of the present invention can be fabricated by the detail fabricating method described above. From above, the array substrate of embodiments of the present invention can be fabricated through nine masks, so as to simplify the process and reduce the fabricating cost at the same time. Furthermore, an additional shielding layer does not need to be used, because the backlight can be shielded effectively by bottom gates for inhibiting production of photocurrent. Furthermore, each of the sources/drains is directly contacted with heavily doped region without through a through hole of the interlayer dielectric (ILD) layer, thereby reducing the contact resistance and improving the product yield.

The present invention has been described with a preferred embodiment thereof and it is understood that many changes and modifications to the described embodiment can be carried out without departing from the scope and the spirit of the invention that is intended to be limited only by the appended claims.

What is claimed is:

1. A method of fabricating an array substrate, comprising the following steps of:
    providing a transparent substrate having a first portion and a second portion neighboring each other, and a first surface and a second surface facing each other;
    forming a buffer layer on the first surface of the transparent substrate, wherein the buffer layer is located on the first portion and the second portion;
    forming a first gate pattern and a second gate pattern on the buffer layer, wherein the first gate pattern and the second gate pattern are formed respectively on the first portion and the second portion;
    providing a transparent insulating layer covering the first gate pattern, the second gate pattern and the buffer layer;
    forming a first polysilicon pattern and a second polysilicon pattern on the transparent insulating layer, wherein the first polysilicon pattern has a first region and a second region adjacent to the first region, and the second polysilicon pattern has a third region and a fourth region adjacent to the third region;
    providing a photoresist layer covering the first polysilicon pattern, the second polysilicon pattern and the transparent insulating layer;
    providing an exposure light source in a direction from the second surface toward the first surface of the transparent substrate by using the first gate pattern and the second gate pattern as a light shielding layer, such that the photoresist layer forms a first photoresist pattern on the first region of the first polysilicon pattern and a second photoresist pattern on the third region of the second polysilicon pattern; and
    performing a first doping step to the first polysilicon pattern and the second polysilicon pattern in a direction from the first surface toward the second surface of the transparent substrate, such that the second region forms a first lightly doped polysilicon region and the fourth region forms a second lightly doped polysilicon region.

2. The method of fabricating an array substrate according to claim 1, wherein the first doping step is to dope a plurality of n-type dopants into the second region and the fourth region by using an ion implanting process.

3. The method of fabricating an array substrate according to claim 1, wherein after performing the first doping step, further comprising: performing a second doping step so as to form an n-type heavily doped polysilicon region in a peripheral portion of the first lightly doped polysilicon region, wherein the first lightly doped polysilicon region is located between the n-type heavily doped polysilicon region and the first region.

4. The method of fabricating an array substrate according to claim 3, wherein after performing the second doping step, further comprising: performing a third doping step to form a p-type heavily doped polysilicon region in the fourth region by implanting a plurality of p-type dopants in an ion implanting process.

5. The method of fabricating an array substrate according to claim 4, wherein after performing the third doping step, further comprising: forming a first source and a first drain on the n-type heavily doped polysilicon region; and forming a second source and a second drain on the p-type heavily doped polysilicon region.

6. The method of fabricating an array substrate according to claim 5, wherein after performing the step of forming the first source/drain and the second source/drain respectively on the n-type heavily doped polysilicon region and the p-type heavily doped polysilicon region, further comprising: providing a first insulating layer covering the first source, the first lightly doped polysilicon region, the first region, the transparent insulating layer, the second source, the third region and the second drain, so as to expose the first drain.

7. The method of fabricating an array substrate according to claim 6, further comprising: forming a first transparent conductive layer on the first insulating layer.

8. The method of fabricating an array substrate according to claim 7, further comprising: providing a second insulating layer covering the first transparent conductive layer and the first insulating layer, so as to expose the first drain.

9. The method of fabricating an array substrate according to claim 8, further comprising: providing a second transparent conductive layer patterned and formed on the first drain and the second insulating layer.

* * * * *